(12) United States Patent
Sugiura

(10) Patent No.: US 7,848,170 B2
(45) Date of Patent: Dec. 7, 2010

(54) NONVOLATILE SEMICONDUCTOR MEMORY

(75) Inventor: Yoshihisa Sugiura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 95 days.

(21) Appl. No.: 12/407,938

(22) Filed: Mar. 20, 2009

(65) Prior Publication Data

US 2010/0020628 A1     Jan. 28, 2010

(30) Foreign Application Priority Data

Jul. 25, 2008     (JP) ............................. 2008-192470

(51) Int. Cl.
    *G11C 5/14* (2006.01)
(52) U.S. Cl. ............. 365/226; 365/189.08; 365/189.09
(58) Field of Classification Search ................. 365/226, 365/230.06, 189.09, 189.08, 194
    See application file for complete search history.

(56) References Cited

U.S. PATENT DOCUMENTS

| | | | |
|---|---|---|---|
| 6,549,456 B2 * | 4/2003 | Werner et al. .......... 365/185.03 |
| 6,642,757 B2 | 11/2003 | Ikehashi et al. | |
| 7,116,603 B2 * | 10/2006 | Kanda et al. ............. 365/225.7 |
| 7,196,950 B2 * | 3/2007 | Kanda et al. ................ 365/194 |
| 7,248,502 B2 * | 7/2007 | Isobe et al. ............ 365/185.28 |
| 7,660,161 B2 * | 2/2010 | Van Tran ............... 365/185.21 |
| 2003/0218497 A1 | 11/2003 | Ikehashi et al. | |

FOREIGN PATENT DOCUMENTS

JP     2004-152405     5/2004

* cited by examiner

*Primary Examiner*—Gene N. Auduong
(74) *Attorney, Agent, or Firm*—Oblon, Spivak, McClelland, Maier & Neustadt, L.L.P.

(57) ABSTRACT

A nonvolatile semiconductor memory has a first memory chip set so as to be operated by specifying the chip address upon reset; and a second memory chip set so as not to be specified by the chip address and not to be operated upon reset, the first memory chip and the second memory chip each comprising a power-on reset circuit which detects a power supply voltage after power-on and outputs a reset signal for resetting an operation when the power supply voltage is equal to or higher than a predetermined value.

20 Claims, 10 Drawing Sheets

NONVOLATILE SEMICONDUCTOR MEMORY

CROSS-REFERENCE TO RELATED APPLICATION

This application is based upon and claims the benefit of priority from the prior Japanese Patent Application No. 2008-192470, filed on Jul. 25, 2008, the entire contents of which are incorporated herein by reference.

BACKGROUND OF THE INVENTION

1. Field of the Invention

The present invention relates to a nonvolatile semiconductor memory having a plurality of memory chips mounted in a single package.

2. Background Art

As a method for obtaining a large-capacity semiconductor memory product without changing the footprint of the package of the product, a multichip packaging technique is available. In this technique, a plurality of memory chips are stacked in a package.

In some nonvolatile semiconductor memories using the multichip packaging technique according to the prior art, for example, a plurality of memory chips requiring ROM reading are used and the timing of start of ROM reading is varied at power-on among the plurality of memory chips.

Thus when the plurality of memory chips are used, power consumption is reduced during ROM reading immediately after power-on (for example, see Japanese Patent Laid-Open No. 2004-152405).

SUMMARY OF THE INVENTION

According to one aspect of the present invention, there is provided: a nonvolatile semiconductor memory comprising:

a first memory chip set so as to be operated by specifying the chip address upon reset; and a second memory chip set so as not to be specified by the chip address and not to be operated upon reset, the first memory chip and the second memory chip each comprising a power-on reset circuit which detects a power supply voltage after power-on and outputs a reset signal for resetting an operation when the power supply voltage is equal to or higher than a predetermined value, the power-on reset circuit including:

a first voltage dividing resistor having one end connected to a power supply;

a second voltage dividing resistor connected between an other end of the first voltage dividing resistor and ground;

a PMOS transistor having a source connected to the power supply and a gate fed with a voltage corresponding to a voltage on a first contact between the first voltage dividing resistor and the second voltage dividing resistor;

an output resistor connected between a drain of the PMOS transistor and the ground;

a switch element connected between the power supply and the first contact;

a voltage dividing ratio adjusting resistor connected in series with the switch element between the power supply and the first contact;

a switching circuit which outputs a switching signal for switching on/off the switch element; and an output terminal connected to a second contact between the PMOS transistor and the output resistor to output the reset signal, wherein in the power-on reset circuit of the first memory chip, the switching circuit turns on the switch element, and in the power-on reset circuit of the second memory chip, the switching circuit turns off the switch element.

According to the other aspect of the present invention, there is provided: a nonvolatile semiconductor memory comprising:

a first memory chip set so as to be operated by specifying the chip address upon reset; and a second memory chip set so as not to be specified by the chip address and not to be operated upon reset, the first memory chip and the second memory chip each comprising a power-on reset circuit which detects a power supply voltage after power-on and outputs a reset signal for resetting an operation when the power supply voltage is equal to or higher than a predetermined value, the power-on reset circuit including:

a first voltage dividing resistor having one end connected to a power supply;

a second voltage dividing resistor connected between an other end of the first voltage dividing resistor and ground;

a PMOS transistor having a source connected to the power supply and a gate fed with a voltage corresponding to a voltage on a first contact between the first voltage dividing resistor and the second voltage dividing resistor;

an output resistor connected between a drain of the PMOS transistor and the ground;

a switch element connected between the ground and the first contact;

a voltage dividing ratio adjusting resistor connected in series with the switch element between the ground and the first contact;

a switching circuit which outputs a switching signal for switching on/off the switch element; and an output terminal connected to a second contact between the PMOS transistor and the output resistor to output the reset signal, wherein in the power-on reset circuit of the first memory chip, the switching circuit turns off the switch element, and in the power-on reset circuit of the second memory chip, the switching circuit turns on the switch element.

According to still further aspect of the present invention, there is provided: a nonvolatile semiconductor memory comprising:

a first memory chip set so as to be operated by specifying the chip address upon reset; and a second memory chip set so as not to be specified by the chip address and not to be operated upon reset, the first memory chip and the second memory chip each comprising a power-on reset circuit which detects a power supply voltage after power-on and outputs a reset signal for resetting an operation when the power supply voltage is equal to or higher than a predetermined value, the power-on reset circuit including:

a first voltage dividing resistor having one end connected to a power supply;

a second voltage dividing resistor connected between an other end of the first voltage dividing resistor and ground;

a PMOS transistor having a source connected to the power supply and a gate fed with a voltage corresponding to a voltage on a first contact between the first voltage dividing resistor and the second voltage dividing resistor;

an output resistor connected between a drain of the PMOS transistor and the ground;

a switch element connected between the ground and the first contact;

a voltage dividing ratio adjusting resistor connected in series with the switch element between the ground and the first contact;

a switching circuit which outputs a switching signal for switching on/off the switch element; and an output terminal connected to a second contact between the PMOS transistor and the output resistor to output the reset signal, wherein in the power-on reset circuit of the first memory chip, the switching circuit turns off the switch element, and in the power-on reset circuit of the second memory chip, the switching circuit turns off the switch element when the power supply voltage is lower than a set voltage, and the switching circuit turns on the switch element when the power supply voltage is equal to or higher than the set voltage.

BRIEF DESCRIPTION OF THE DRAWINGS

FIG. 12A is a figure showing a voltage on each contact of the power-on reset circuit 18 shown in FIG. 10 and a voltage of the output signal at power-on;

DETAILED DESCRIPTION

Comparative Example

Figure 1:
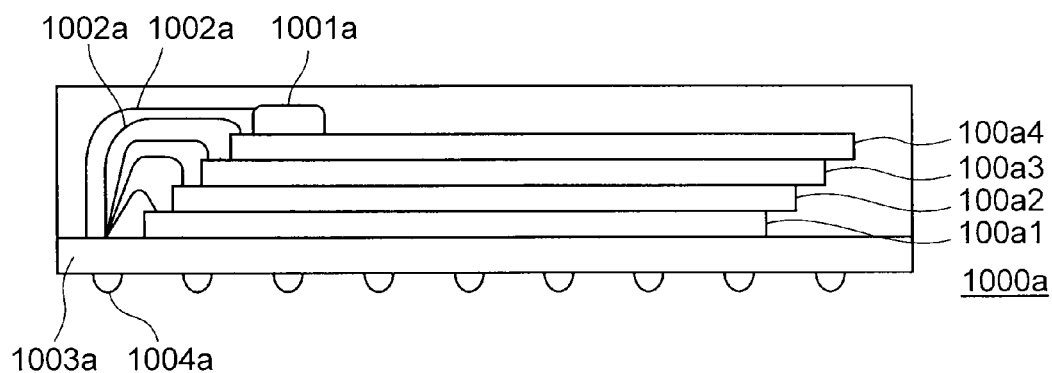
FIG. 1 is a sectional view showing an example of a schematic cross section of a multichip package product (nonvolatile semiconductor memory 1000*a*) as a comparative example in which four memory chips 100*a*1 to 100*a*4 are stacked.

FIG. 1 is a sectional view showing an example of a schematic cross section of a multichip package product (nonvolatile semiconductor memory 1000*a*) as a comparative example in which four memory chips 100*a*1 to 100*a*4 are stacked.

As shown in FIG. 1, the nonvolatile semiconductor memory 1000*a* includes the four memory chips 100*a*1 to 100*a*4 stacked on a substrate 1003*a*, and a controller 1001*a*.

These memory chips 100*a*1 to 100*a*4 are, for example, NAND flash memory chips.

The controller 1001*a* mainly controls data input/output of the memory chips 100*a*1 to 100*a*4 and performs data management. The controller 1001*a* has an ECC correcting circuit (not shown) which adds an error-correcting code (ECC) during writing of data and analyzes and processes the error-correcting code during reading of data.

The memory chips 100*a*1 to 100*a*4 and the controller 1001*a* are bonded to the substrate 1003*a* via wires 1002*a*.

Solder balls 1004*a* provided on the back side of the substrate 1003*a* are electrically connected to the wires 1002*a*. As a package shape, for example, a ball grid array (BGA) of surface mount type is used in which the solder balls 1004*a* are two-dimensionally arranged.

Figure 2:
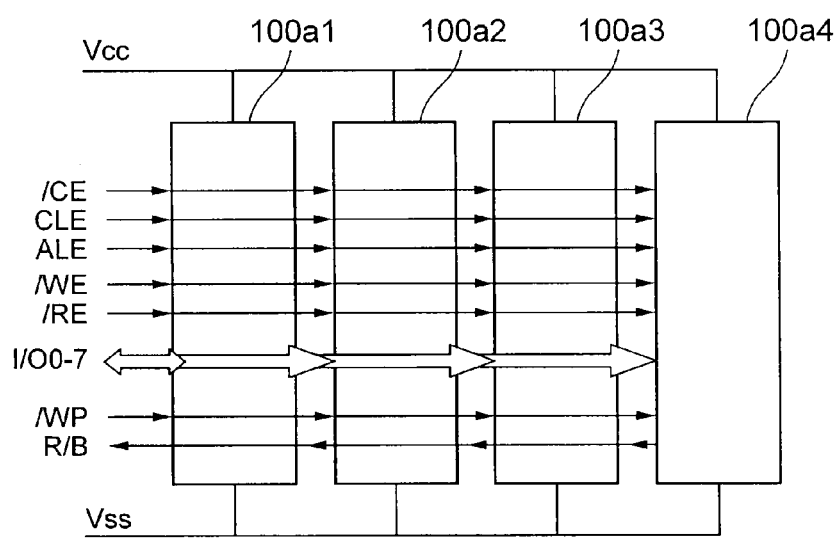
FIG. 2 is a circuit diagram showing the four memory chips of the nonvolatile semiconductor memory 1000*a* shown in FIG. 1.

FIG. 2 is a circuit diagram showing the four memory chips of the nonvolatile semiconductor memory 1000*a* shown in FIG. 1.

As shown in FIG. 2, the control line, the I/O line, and the power supply line of the four memory chips 100*a*1 to 100*a*4 are shared on the substrate 1003*a* of the package. The memory chips are selected by inputting an address.

When a wafer is fabricated, the four memory chips 100*a*1 to 100*a*4 are the same product. However, after assembly into the package, the addresses of the memory chips 100*a*1 to 100*a*4 are set in the address setting circuits (not shown) of the memory chips, and each of the memory chips is controlled so as to be selected or unselected according to the high-order two bits of an address inputted from the outside.

By increasing the bits of the chip address to, for example, three bits or four bits, the number of mounted chips can be increased to, for example, eight chips or 16 chips, so that a larger number of chips can be controlled.

Generally, a semiconductor memory product includes a power-on reset circuit which detects the rise of a power supply at power-on and outputs a reset signal for resetting the internal state of a memory chip to a predetermined initial state.

In the multichip package product, a power-on reset circuit provided in each memory chip outputs a reset signal, detects the rise of a power supply, and resets each memory chip to the initial state. After the reset, for example, the memory chip 100*a*1 is selected and the memory chips 100*a*2 to 100*a*4 are unselected.

Figure 3:
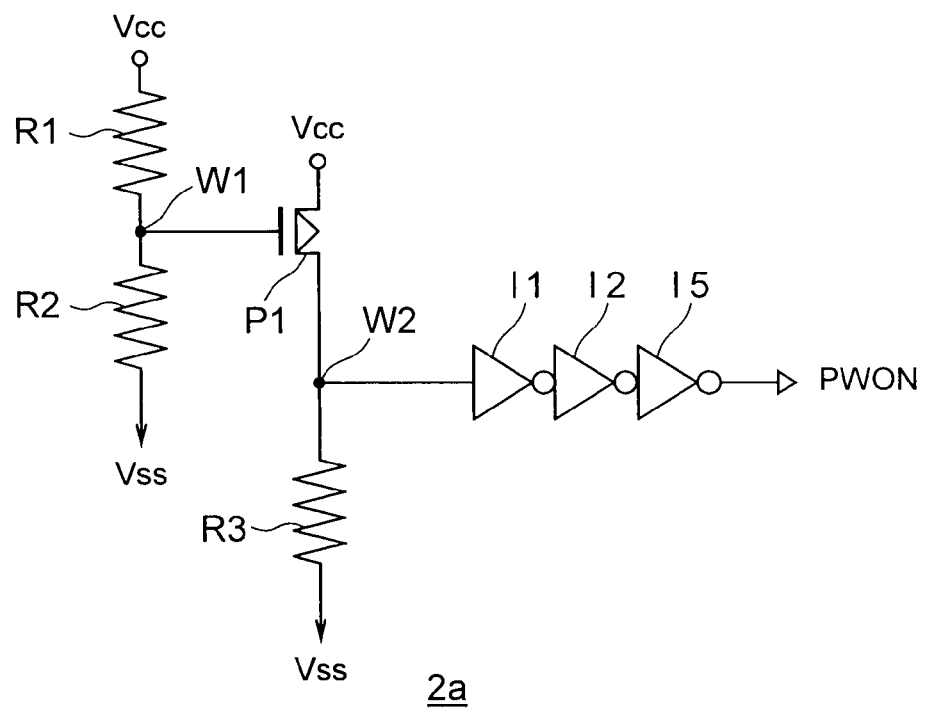
FIG. 3 is a circuit diagram showing an example of the configuration of the power-on reset circuit according to the comparative example.

FIG. 3 is a circuit diagram showing an example of the configuration of the power-on reset circuit according to the comparative example.

As shown in FIG. 3, a PMOS transistor P1 of a power-on reset circuit 2*a* has the source fed with a power supply voltage Vcc and the gate fed with a voltage on a contact W1. The voltage on the contact W1 is obtained by dividing the power supply voltage Vcc by a resistor R1 and a resistor R2.

Further, a voltage on a contact W2 is obtained by dividing the power supply voltage Vcc by the PMOS transistor P1 and a resistor R3 and is outputted as a reset signal PWON of the power-on reset circuit 2a through inverters I1, I2, and I5.

Figure 4:
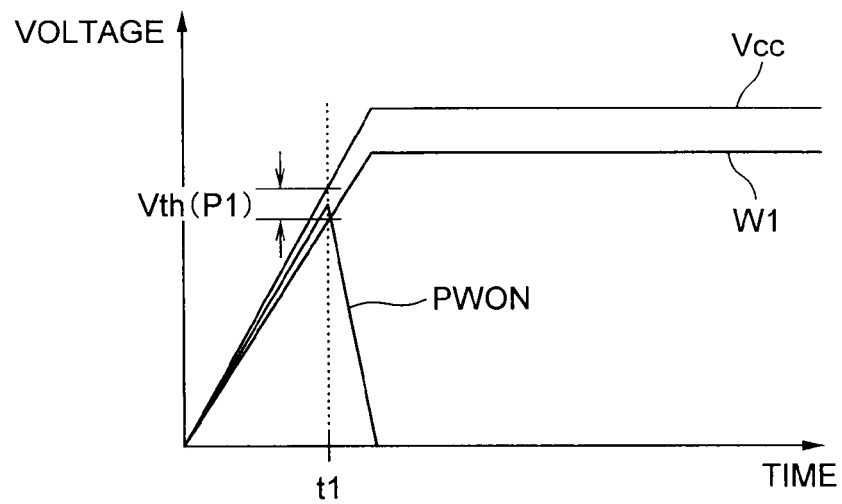
FIG. 4 shows a voltage on each contact and a voltage of the output signal (reset signal) at power-on in the power-on reset circuit 2*a* of FIG. 3.

FIG. 4 shows a voltage on each contact and a voltage of the output signal (reset signal) at power-on in the power-on reset circuit 2a of FIG. 3.

As shown in FIG. 4, when the power supply voltage Vcc rises from 0 V, the rise of the voltage of the first contact W1 is delayed from the power supply voltage Vcc by the resistive division. When the power supply voltage Vcc is low, a potential difference between the source and the gate is small and thus the PMOS transistor P1 is turned off (shut off). Thus the reset signal PWON increases with the power supply voltage Vcc.

When the power supply voltage Vcc increases to a certain voltage (power-on detecting voltage), a difference between the power supply voltage Vcc and the voltage on the first contact W1 reaches a threshold voltage Vth (P1) of the transistor P1 (time t1). When the power supply voltage Vcc is equal to or higher than the threshold voltage, the PMOS transistor P1 is turned on (conducting). Thus the reset signal PWON is set at "Low" level.

Therefore, the power-on reset circuit 2a generates the reset signal PWON (pulse signal) as the output signal when the power supply voltage Vcc rises. The reset signal PWON is used for resetting all circuits in the memory chip. When the reset signal PWON is at "High" level, the internal state of the memory chip is reset to the initial state.

As described above, the power-on detecting voltage of the power-on reset circuit 2a is determined by the threshold voltage of the PMOS transistor P1, resulting in a variation of about several tens mV between the memory chips.

The power-on detecting voltage is set sufficiently lower than the operation guaranteed range of a product and thus does not affect operations in ordinary cases. However, when the power supply voltage Vcc is reduced below the power-on detecting voltage by noise, the reset signal PWON is outputted and the inside of the memory chip is reset to the initial state. In this case, when the power supply voltage Vcc returns to the original operation guaranteed range and a normal operation can be started again, no problem arises. However, the memory chip may perform abnormal operations under some conditions.

Figure 5:
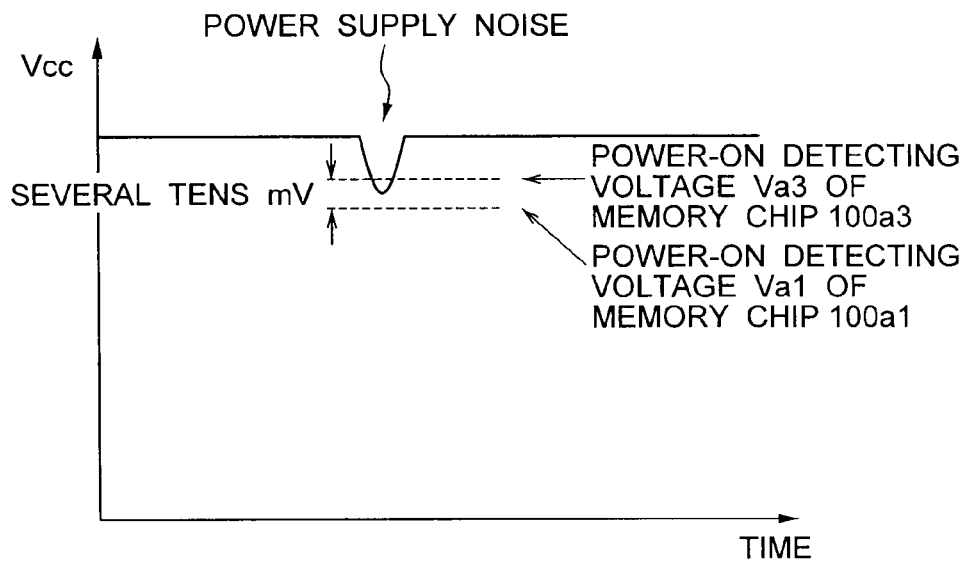
FIG. 5 shows the relationship between the power-on detecting voltage and the power supply voltage Vcc of the power-on reset circuit 2*a* shown in FIG. 3.
Figure 6:
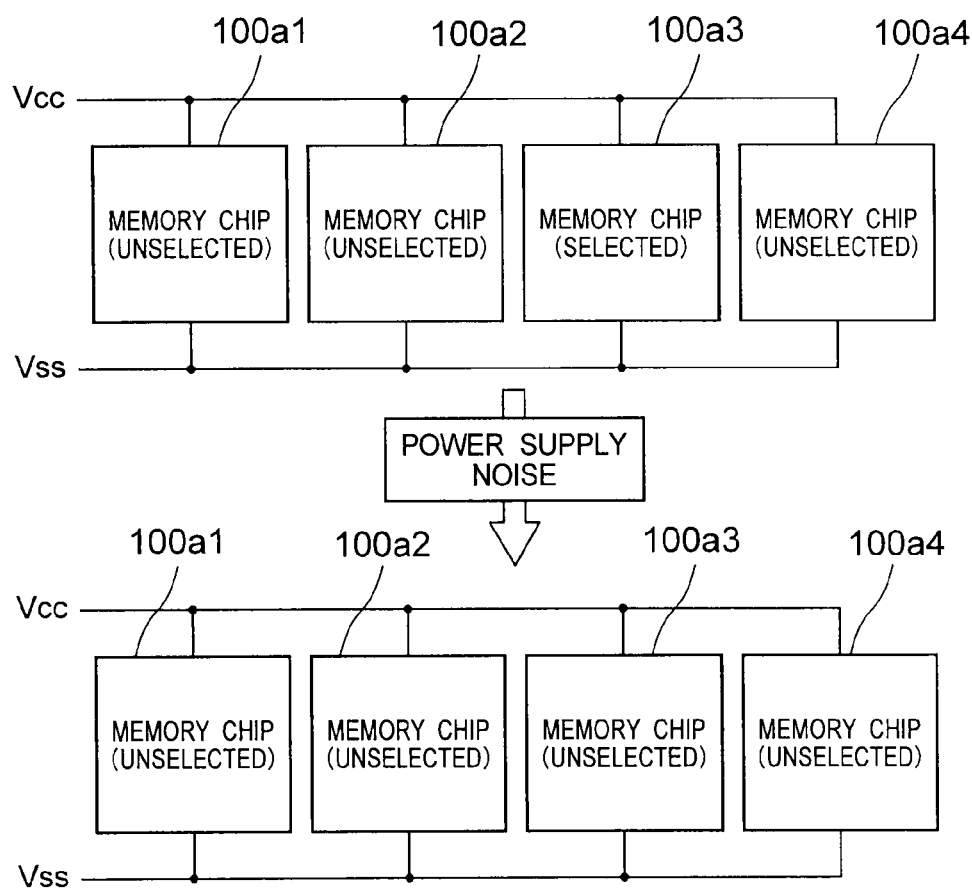
FIG. 6 shows an example of the transition of selection among the memory chips 100*a*1 to 100*a*4 shown in FIG. 2.

FIG. 5 shows the relationship between the power-on detecting voltage and the power supply voltage Vcc of the power-on reset circuit 2a shown in FIG. 3. FIG. 6 shows an example of the transition of selection among the memory chips 100a1 to 100a4 shown in FIG. 2. In FIG. 6, the memory chip 100a3 is selected before power supply noise is induced.

For example, the following will examine the case where the power supply noise of FIG. 5 is induced when a power-on detecting voltage Va1 of the memory chip 100a1 is set lower than power-on detecting voltages Va2 to Va4 of the other memory chips 100a2 to 100a4 by variations in the threshold voltage of the PMOS transistor P1.

The power supply voltage Vcc is set lower than the power-on detecting voltage Va3 by power supply noise and the power-on reset circuit 2a of the memory chip 100a3 outputs the reset signal PWON. Thus as shown in FIG. 6, the memory chip 100a3 is brought into a chip unselected state which is the initial state.

On the other hand, as described above, the power-on detecting voltage Va1 of the power-on reset circuit 2a in the memory chip 100a1 is set lower than the power supply noise.

Thus the power-on reset circuit 2a of the memory chip 100a1 does not output the reset signal PWON. In other words, as shown in FIG. 6, the memory chip 100a1 is left unselected even after the power supply noise disappears.

As a result, even when returning to a standby state after the power supply noise disappears, all the memory chips 100a1 to 100a4 are left unselected.

In this state, when requesting the memory chips 100a1 to 100a4 to perform an operation not requiring a chip address, for example, ID code reading, all the memory chips 100a1 to 100a4 may become incapable of outputting signals.

Thus according to the embodiments of the present invention, a nonvolatile semiconductor memory is provided which reduces the influence of variations in the threshold voltage of a transistor of a power-on reset circuit and performs a desired operation even when power supply reducing noise is instantaneously induced.

The embodiments of the present invention will be described below in accordance with the accompanying drawings.

First Embodiment

Figure 7:
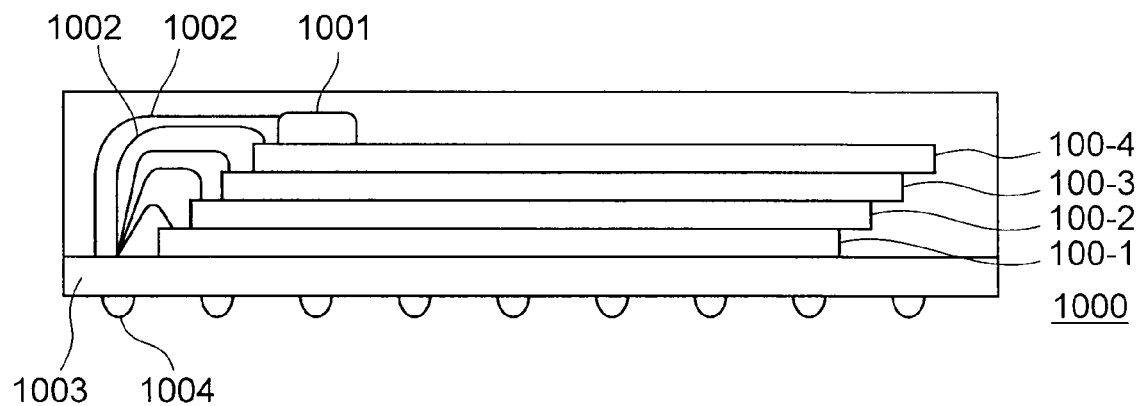
FIG. 7 is a sectional view showing an example of a schematic cross section of the main part of a nonvolatile semiconductor memory 1000 according to a first embodiment which is an aspect of the present invention.

FIG. 7 is a sectional view showing an example of a schematic cross section of the main part of a nonvolatile semiconductor memory 1000 according to a first embodiment which is an aspect of the present invention.

As shown in FIG. 7, the nonvolatile semiconductor memory 1000 includes four memory chips 100-1 to 100-4 stacked on a substrate 1003, and a controller 1001.

These memory chips 100-1 to 100-4 are, for example, NAND flash memory chips.

The controller 1001 mainly controls data input/output of the memory chips 100-1 to 100-4 and performs data management. The controller 1001 has an ECC correcting circuit (not shown) which adds an error-correcting code (ECC) during writing of data and analyzes and processes the error-correcting code during reading of data.

The memory chips 100-1 to 100-4 and the controller 1001 are bonded to the substrate 1003 via wires 1002.

Solder balls 1004 provided on the back side of the substrate 1003 are electrically connected to the wires 1002. As a package shape, for example, a ball grid array (BGA) of surface mount type is used in which the solder balls 1004 are two-dimensionally arranged.

Figure 8:
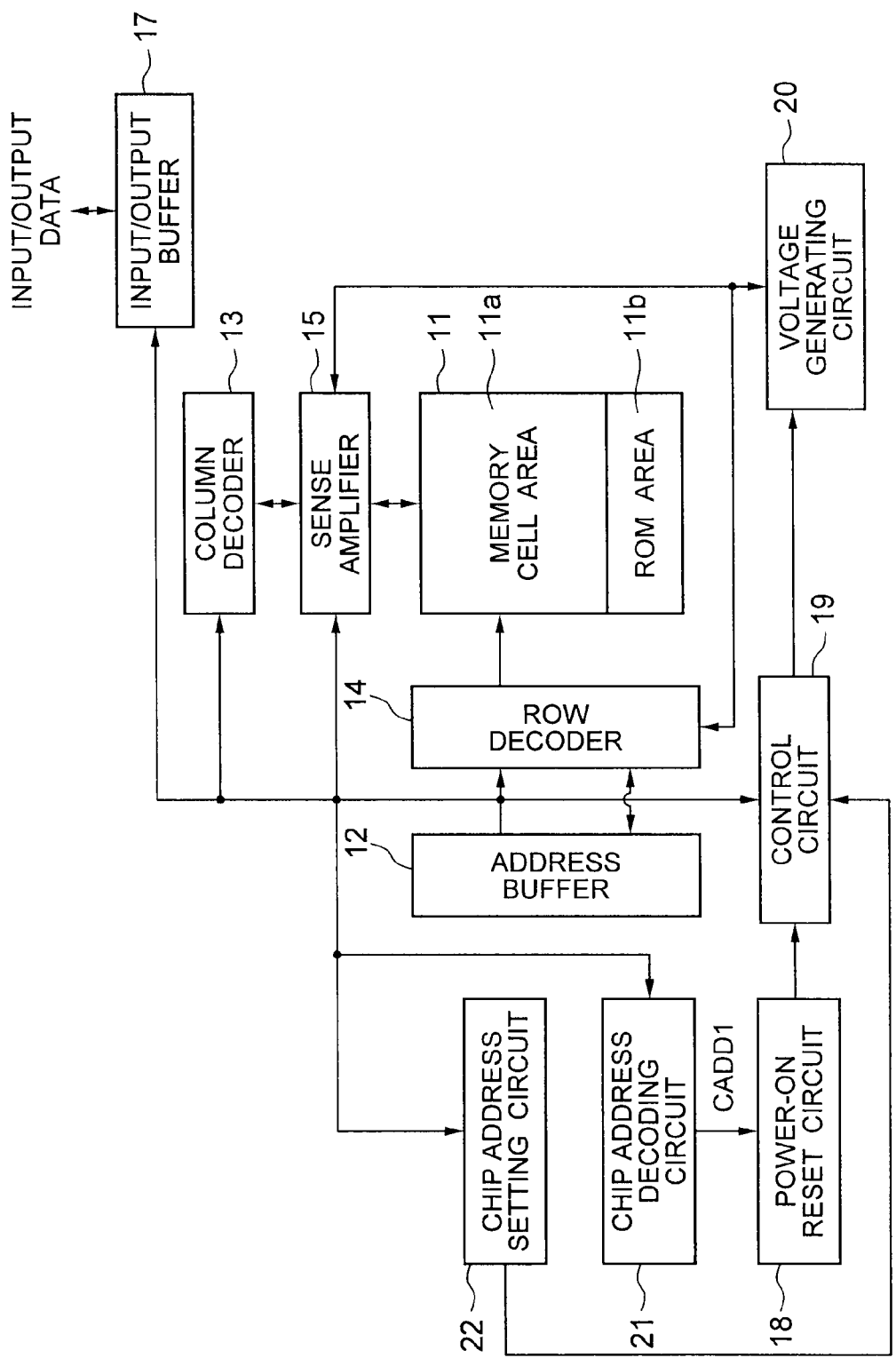
FIG. 8 is a figure showing an example of the internal configuration of each of the memory chips 100-1 to 100-4 in the nonvolatile semiconductor memory 1000 shown in FIG. 7.

FIG. 8 shows an example of the internal configuration of each of the memory chips 100-1 to 100-4 in the nonvolatile semiconductor memory 1000 shown in FIG. 7.

As shown in FIG. 8, the memory chips 100-1 to 100-4 each include a memory cell array 11, an address buffer 12, a column decoder 13, a row decoder 14, a sense amplifier 15, an input/output buffer 17, a power-on reset circuit 18, a control circuit 19, a voltage generating circuit 20, a chip address decoding circuit 21, and a chip address setting circuit 22.

The memory cell array 11 has a normal memory cell area 11a for storing data and a ROM area 11b for storing redundancy information, trimming information, and so on.

Of addresses inputted to the address buffer 12, a column address is inputted to the column decoder 13 and is decoded therein and a row address is inputted to the row decoder 14 and is decoded therein. Based on the specified address, data is written into or read from memory cells in the memory cell area 11a.

When data is read, the read data is outputted through the sense amplifier 15, the column decoder 13, and the input/output buffer 17.

When data is written, the written data is supplied to the memory cell array 11 in the reverse path of reading.

The voltage generating circuit 20 generates a reference voltage to be referred and an internal voltage such as a program voltage by using a power supply voltage Vcc supplied from the outside.

The chip address setting circuit 22 compares 2-bit row addresses ADD_0 and ADD_1, which have been inputted through the address buffer 12, with 2-bit chip addresses CHIPADD_0 and CHIPADD_1 (chip selection information) which have been determined by bonding. After that, the chip address setting circuit 22 outputs the comparison result to the control circuit 19. Thus based on the comparison result, the control circuit 19 operates the memory chip. In other words, the memory chip corresponding to the comparison result is specified by the chip addresses and the only the memory chip is operated.

In this configuration, the chip address setting circuit 22 is set so as to specify one of the memory chips 100-1 to 100-4 by the chip addresses even when the row addresses are not inputted upon reset, for example, at power-on. Thus for example, the memory chip 100-1 is set so as to be specified and operated by the chip addresses upon reset (in other words, the memory chip 100-1 is set to be selected upon reset). On the other hand, the memory chips 100-2 to 100-4 are set so as not to be specified and not to be operated by the chip addresses upon reset (in other words, the memory chips 100-2 to 100-4 are set not to be selected upon reset).

The chip address decoding circuit 21 calculates the 2-bit chip addresses CHIPADD_0 and CHIPADD_1 specific to each memory chip, and outputs a signal CADD1, which is the calculation result, to the power-on reset circuit 18.

The power-on reset circuit 18 outputs a reset signal PWON to the control circuit 19 according to the power supply voltage Vcc. For example, the power-on reset circuit 18 is set so as to output the reset signal PWON (pulse wave) when the power supply voltage Vcc reaches at least a power-on detecting voltage after power-on.

In the power-on reset circuit 18, the power-on detecting voltage is controlled by the signal CADD1.

The control circuit 19 outputs, based on the reset signal PWON, a control signal for initializing the address buffer 12, the column decoder 13, the row decoder 14, the sense amplifier 15, and the voltage generating circuit 20.

Further, as described above, the control circuit 19 operates the memory chip based on the comparison result of the chip address setting circuit 22. In other words, the memory chip corresponding to the comparison result is specified by the chip addresses and only the memory chip is operated.

As has been discussed, the memory chips of the nonvolatile semiconductor memory 1000 each include the power-on reset circuit 18 for detecting the power supply voltage Vcc after power-on and outputting the reset signal PWON for initializing the operation when the power supply voltage Vcc reaches at least a predetermined value.

Figure 9:
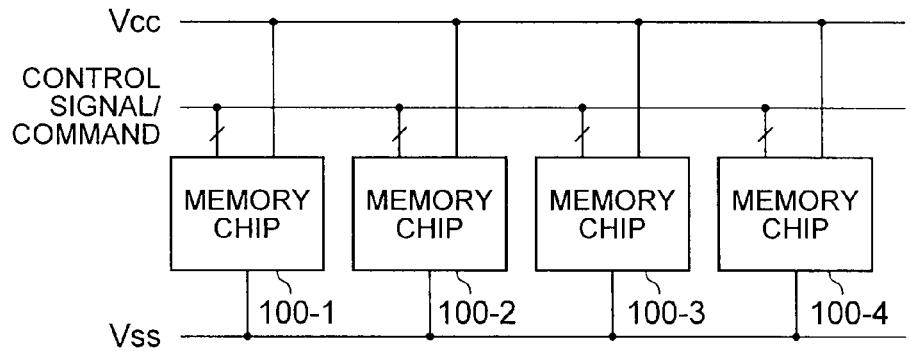
FIG. 9 is a block diagram showing the nonvolatile semiconductor memory 1000 including the four memory chips 100-1 to 100-4 shown in FIG. 7.

FIG. 9 is a block diagram showing the nonvolatile semiconductor memory 1000 including the four memory chips 100-1 to 100-4 shown in FIG. 7.

As shown in FIG. 9, a power supply pad (Vcc), a ground pad (Vss), various pads for inputting commands and control signals such as /CE (chip enable signal), /WE (write enable signal), and /RE (read enable signal), and an input/output pad for I/O and the like are connected to one another via the four memory chips 100-1 to 100-4 by shared wiring.

In addition to the pads, the four memory chips 100-1 to 100-4 each include two pads for inputting the 2-bit chip addresses CHIPADD_0 and CHIPADD_1 to specify chip addresses, as will be described later.

Further, to the two pads for specifying chip addresses, voltages (the power supply voltage Vcc or a ground voltage Vss) corresponding to the respective chip addresses are connected via bonding wires, so that the correspondence between the memory chips and the chip addresses is determined.

For example, in the memory chip 100-1, the pads for specifying CHIPADD_0 and CHIPADD_1 are both connected to the ground voltage Vss. In the memory chip 100-2, the pad for specifying CHIPADD_0 is connected to the ground voltage Vss and the pad for specifying CHIPADD_1 is connected to a power supply voltage VDD. In the memory chip 100-3, the pad for specifying CHIPADD_0 is connected to the power supply voltage VDD and the pad for specifying CHIPADD_1 is connected to the ground voltage Vss. In the memory chip 100-4, the pads for specifying CHIPADD_0 and CHIPADD_1 are both connected to the power supply voltage VDD.

To access the memory chips 100-1 to 100-4 from the outside, commands, addresses, and data are inputted and outputted as in the case where only a single memory chip is provided. The addresses are inputted in an address space four times as large as the case where only a single memory chip is provided. The plurality of memory chips simultaneously receive the addresses and each determine whether the memory chips correspond to the received addresses or not, so that only the corresponding chip is operated.

As described above, the chip address setting circuit 22 compares the inputted 2-bit row addresses ADD_0 and ADD_1 with the 2-bit chip addresses CHIPADD_0 and CHIPADD_1 determined by bonding. Further, the chip address setting circuit 22 outputs the comparison result to the control circuit 19. Thus based on the comparison result, the control circuit 19 operates the memory chip. In other words, only the memory chip corresponding to the comparison result is operated.

Thus even though the plurality of memory chips are mounted, it looks as if a single memory chip is operated with a quadrupled memory capacity when viewed from the outside of the package.

The number of pads for specifying chip addresses is not limited to two. For example, when eight memory chips are stored in the same package, three pads are provided for specifying chip addresses. When 16 memory chips are stored, four pads are provided for specifying chip addresses.

Figure 10:
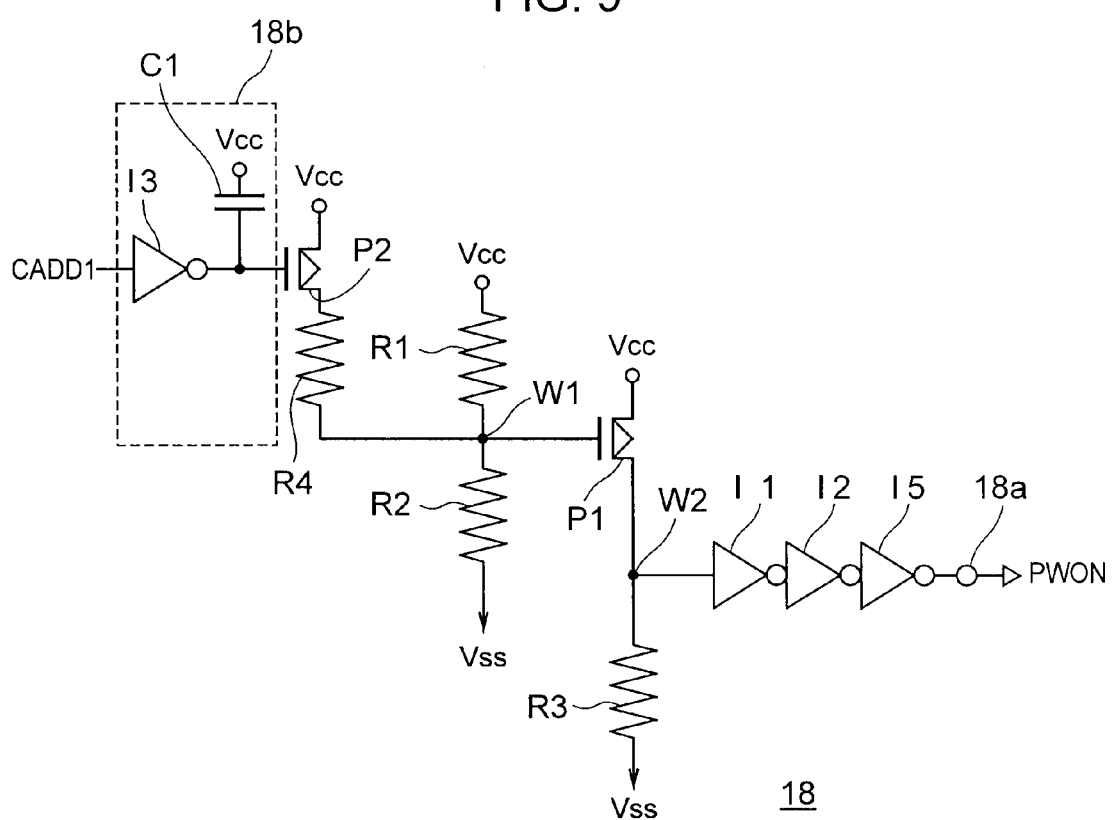
FIG. 10 is a circuit diagram showing the configuration of the power-on reset circuit 18 according to the first embodiment of the memory cell shown in FIG. 8.

FIG. 10 is a circuit diagram showing the configuration of the power-on reset circuit 18 according to the first embodiment of the memory cell shown in FIG. 8.

As shown in FIG. 10, the power-on reset circuit 18 includes a first voltage dividing resistor R1, a second voltage dividing resistor R2, an output resistor R3, a voltage dividing ratio adjusting resistor R4, a PMOS transistor P1, a switch element P2, an output terminal 18a, and a switching circuit 18b.

The first voltage dividing resistor R1 has one end connected to a power supply.

The second voltage dividing resistor R2 is connected between the other end of the first voltage dividing resistor R1 and the ground.

The PMOS transistor P1 has the source connected to the power supply and the gate fed with a voltage corresponding to a voltage on a first contact W1 between the first voltage dividing resistor R1 and the second voltage dividing resistor R2.

The output resistor R3 is connected between the drain of the PMOS transistor P1 and the ground.

The switch element P2 is connected between the power supply and the first contact W1. The switch element P2 is made up of, for example, a PMOS transistor in this configuration. The switch element P2 may be made up of other elements such as a transistor.

The voltage dividing ratio adjusting resistor R4 is connected in series with the switch element P2 between the power supply and the first contact W1.

The output terminal 18a is connected to a second contact W2 between the PMOS transistor P1 and the output resistor R3 via inverters I1, I2, and I5 and outputs the reset signal PWON.

The switching circuit 18b outputs a switching signal for switching on/off the switch element P2.

The switching circuit 18b has an inverter I3 and a capacitor C1.

The inverter I3 is fed with a signal CADD1 and has the output connected to the gate of the PMOS transistor acting as the switch element P2.

The capacitor C1 has one end connected to the power supply and the other end connected to the gate of the PMOS transistor acting as the switch element P2. The capacitor C1 stabilizes the voltage of the gate of the PMOS transistor acting as the switch element P2.

In other words, the switching circuit 18b outputs the inverted signal of the signal CADD1 as a switching signal to the switch element P2.

Figure 11:
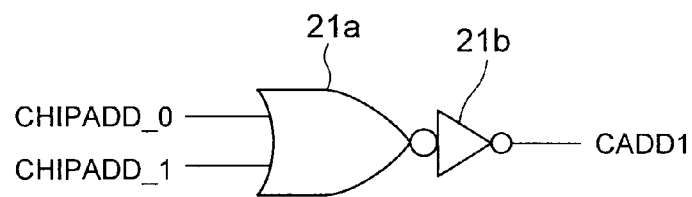
FIG. 11 is a circuit diagram showing an example of the configuration of the chip address decoding circuit 21 according to the first embodiment of the memory chip shown in FIG. 8.

FIG. 11 is a circuit diagram showing an example of the configuration of the chip address decoding circuit 21 according to the first embodiment of the memory chip shown in FIG. 8.

As shown in FIG. 11, the chip address decoding circuit 21 is made up of, for example, an OR circuit 21a which is fed with the chip address (signal) CHIPADD_0 and the chip address (signal) CHIPADD_1 and an inverter 21b which has the input connected to the output of the OR circuit 21a and outputs the signal CADD1.

The chip address decoding circuit 21 outputs the signal CADD1 of "High" level when CHIPADD_0 and CHIPADD_1 are both set at "Low" level.

Further, the chip address decoding circuit 21 outputs the signal CADD1 of "Low" level when CHIPADD_0 and CHIPADD_1 are both set at "High" level or one of CHIPADD_0 and CHIPADD_1 is set at "High" level.

The following will describe an example of the operation of the nonvolatile semiconductor memory 1000 configured thus.

In the power-on reset circuit 18 of the memory chip 100-1, the switching circuit 18b turns on the switch element P2 of the power-on reset circuit 18 (conducting) in response to the signal CADD1 ("High" level).

Thus the resistive division by the voltage dividing resistors R1 and R2 and the voltage dividing ratio adjusting resistor R4 has a small voltage dividing ratio on the power supply side. Thus the voltage on the first contact W1 is increased.

In each of the power-on reset circuits 18 of the memory chips 100-2 to 100-4, the switching circuit 18b turns off (shuts off) the switch element P2 of the power-on reset circuit 18 in response to the signal CADD1 ("Low" level).

With this operation, the resistive division by the voltage dividing resistors R1 and R2 and the voltage dividing ratio adjusting resistor R4 has a large voltage dividing ratio on the power supply side. Thus the voltage on the first contact W1 of the power-on reset circuit 18 in each of the memory chips 100-2 to 100-4 becomes lower than the voltage on the first contact W1 of the power-on reset circuit 18 in the memory chip 100-1.

With this operation, a power-on detecting voltage V1 of the memory chip 100-1 is set higher than power-on detecting voltages V2 to V4 of the other memory chips 100-2 to 100-4.

The resistance value of the voltage dividing ratio adjusting resistor R4 is selected such that differences between the power-on detecting voltage V1 of the memory chip 100-1 and the power-on detecting voltages V2 to V4 of the other memory chips 100-2 to 100-4 are as large as variations in detecting voltage among the memory chips, the variations being caused by variations in the threshold voltage of the PMOS transistor P1.

Figure 12A:
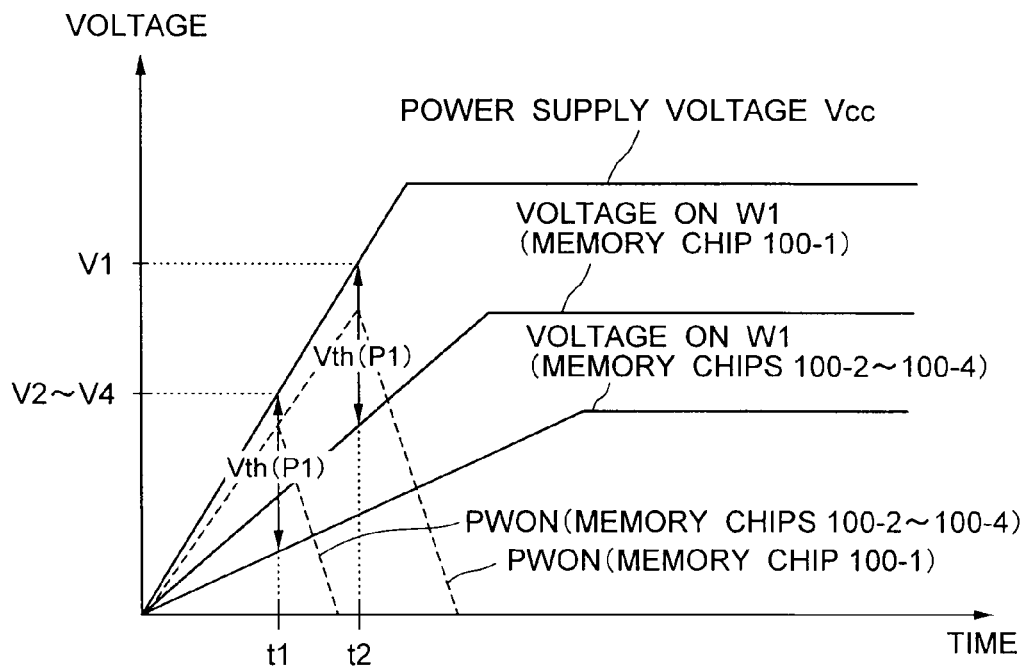

FIG. 12A shows a voltage on each contact of the power-on reset circuit 18 shown in FIG. 10 and a voltage of the output signal at power-on.

As shown in FIG. 12A, in each of the memory chips 100-1 to 100-4, when the power supply voltage Vcc rises from 0 V, the rise of the voltage of the contact W1 is delayed from the power supply voltage Vcc by the resistance division. When the power supply voltage Vcc is low, a potential difference between the source and the gate is small and thus the PMOS transistor P1 is turned off (shut off). Thus the reset signal PWON increases with the power supply voltage Vcc.

When the power supply voltage Vcc increases to a certain voltage (power-on detecting voltages V2 to V4) in the memory chips 100-2 to 100-4, a difference between the power supply voltage Vcc and the voltage on the first contact W1 reaches a threshold voltage Vth (P1) of the transistor P1 (time t1). When the power supply voltage Vcc is equal to or higher than the threshold voltage, the PMOS transistor P1 is turned on (conducting). Thus the reset signal PWON is set at "Low" level.

Therefore, the power-on reset circuit 18 in each of the memory chips 100-2 to 100-4 generates the reset signal PWON (pulse signal) as the output signal when the power supply voltage Vcc rises. The reset signal PWON is used for resetting all circuits in the memory chip. In other words, in response to the reset signal PWON (pulse signal), the internal states of the memory chips 100-2 to 100-4 are reset to the initial states.

In the memory chip 100-1, when the power supply voltage Vcc increases to a certain voltage (the power-on detecting voltage V1: V1>V2 to V4), a difference between the power supply voltage Vcc and the voltage on the first contact W1 reaches the threshold voltage Vth (P1) of the transistor P1 (time t2). When the power supply voltage Vcc is equal to or higher than the threshold voltage, the PMOS transistor P1 is turned on (conducting). Thus the reset signal PWON is set at "Low" level.

Therefore, the power-on reset circuit 18 of the memory chip 100-1 generates the reset signal PWON (pulse signal) as the output signal when the power supply voltage Vcc rises. The reset signal PWON (pulse signal) is used for resetting all the circuits in the memory chip 100-1. In other words, in response to the reset signal PWON (pulse signal), the internal state of the memory chip 100-1 is reset to the initial state.

As described above, the power-on detecting voltage V1 of the power-on reset circuit 18 in the memory chip 100-1 is set higher than the power-on detecting voltages of the power-on reset circuits 18 in the memory chips 100-2 to 100-4.

Figure 12B:
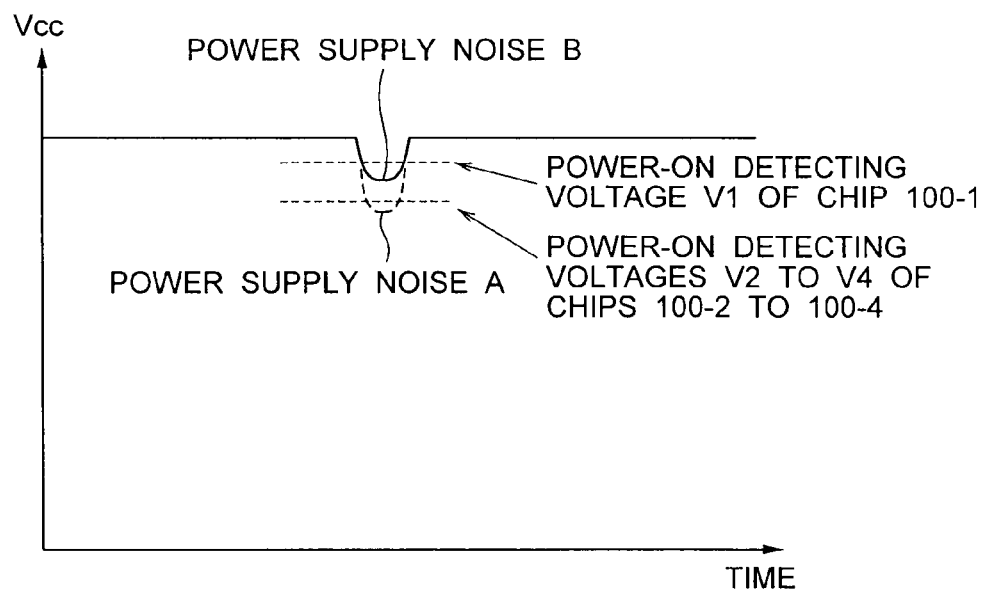
FIG. 12B is a figure showing the relationship between the power-on detecting voltage of the power-on reset circuit 18 shown in FIG. 10 and the power supply voltage Vcc.

FIG. 12B shows the relationship between the power-on detecting voltage of the power-on reset circuit 18 shown in FIG. 10 and the power supply voltage Vcc.

As has been discussed, the power-on detecting voltage V1 of the memory chip 100-1 is set higher than the power-on detecting voltages V2 to V4 of the other memory chips 100-2 to 100-4.

As shown in FIG. 12B, for example, the following will examine the case where the power supply voltage Vcc is reduced below the power-on detecting voltages V1 to V4 by power supply noise A.

In this case, a resetting operation is first started in the memory chip 100-1 regardless of variations in detecting voltage among the memory chips. Next, a resetting operation is started in the second to fourth memory chips 100-2 to 100-4.

The power-on reset circuit 18 in each of the memory chips 100-1 to 100-4 outputs the reset signal PWON. Thus the memory chip 100-1 is reset and selected and the memory chips 100-2 to 100-4 are reset and unselected.

The following will examine the case where the power supply voltage Vcc is reduced below the power-on detecting voltage V1 by the power supply noise B. In this case, the power-on reset circuit 18 of the memory chip 100-1 outputs the reset signal PWON. Thus the memory chip 100-1 is reset and selected and the other memory chips 100-2 to 100-4 are not reset and are selected or unselected.

In this way, at least the memory chip 100-1 is selected after the power supply noise disappears.

In this state, when requesting the memory chips 100-1 to 100-4 to perform an operation not requiring chip addresses, for example, ID code reading, it is possible to avoid a situation in which none of the memory chips 100-1 to 100-4 can output signals.

As described above, the nonvolatile semiconductor memory of the present embodiment can perform a predetermined operation even when power supply noise is inputted.

Second Embodiment

The first embodiment described an example of the configuration of the power-on reset circuit for performing a predetermined operation even when power supply noise is inputted.

A second embodiment will particularly describe another example in which a power-on reset circuit includes a different switch element and a different switching circuit.

Figure 13:
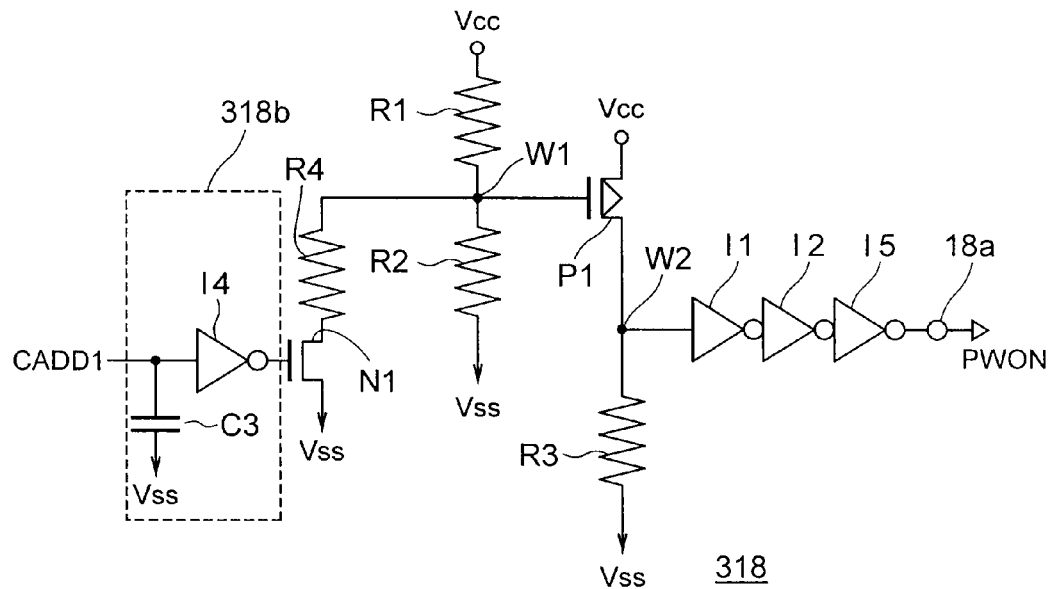
FIG. 13 is a circuit diagram showing the configuration of a power-on reset circuit 318 according to the second embodiment.

FIG. 13 is a circuit diagram showing the configuration of a power-on reset circuit 318 according to the second embodiment. The power-on reset circuit 318 is applicable to the memory chips 100-1 to 100-4 of FIG. 8 as the power-on reset circuit 18 of the first embodiment.

As shown in FIG. 13, as compared with the power-on reset circuit 18 of the first embodiment, a switch element N1 and a switching circuit 318b of the power-on reset circuit 318 are configured differently from the switch element P2 and the switching circuit 18b of the first embodiment.

The switch element N1 is connected between the ground and a first contact W1. The switch element N1 is made up of, for example, an NMOS transistor. The switch element N1 may be made up of other elements such as a transistor.

A voltage dividing ratio adjusting resistor R4 is connected in series with a switch element N2 between the ground and the first contact W1.

The switching circuit 318b outputs a switching signal for switching on/off the switch element N1.

The switching circuit 318b includes an inverter I4 and a capacitor C3.

The inverter I4 is fed with a signal CADD1 and has the output connected to the gate of an NMOS transistor acting as the switch element N1.

The capacitor C3 has one end connected to the ground and the other end connected to the gate of the NMOS transistor acting as the switch element N1. The capacitor C3 stabilizes the voltage of the gate of the NMOS transistor acting as the switch element N1.

In other words, the switching circuit 318b outputs the inverted signal of the signal CADD1 as a switching signal to the switch element N1.

The other configurations of the power-on reset circuit 318 are similar to the configurations of the power-on reset circuit 18 of the first embodiment.

The following will describe an example of the operation of a nonvolatile semiconductor memory 1000 to which the power-on reset circuit 318 is applied.

In the power-on reset circuit 318 of a memory chip 100-1, the switching circuit 318b turns off (shuts off) the switch element N1 of the power-on reset circuit 318 in response to the signal CADD1 ("High" level).

Thus a resistive division by voltage dividing resistors R1 and R2 and a voltage dividing ratio adjusting resistor R4 has a small voltage dividing ratio on the power supply side, so that a voltage on the first contact W1 is increased.

On the other hand, in each of the power-on reset circuits 318 of memory chips 100-2 to 100-4, the switching circuit 318b turns on the switch element N1 of the power-on reset circuit 318 (conducting) in response to the signal CADD1 ("Low" level).

With this operation, the resistive division by the voltage dividing resistors R1 and R2 and the voltage dividing ratio adjusting resistor R4 has a large voltage dividing ratio on the power supply side. Thus the voltage on the first contact W1 of the power-on reset circuit 318 in each of the memory chips 100-2 to 100-4 becomes lower than the voltage on the first contact W1 of the power-on reset circuit 318 in the memory chip 100-1.

With this operation, a power-on detecting voltage V1 of the memory chip 100-1 is set higher than power-on detecting voltages V2 to V4 of the other memory chips 100-2 to 100-4.

The resistance value of the voltage dividing ratio adjusting resistor R4 is selected such that differences between the power-on detecting voltage V1 of the memory chip 100-1 and the power-on detecting voltages V2 to V4 of the other memory chips 100-2 to 100-4 are as large as variations in detecting voltage among the memory chips, the variations being caused by variations in the threshold voltage of a PMOS transistor P1.

Thus as in the first embodiment, when power supply noise is inputted to a power supply voltage Vcc, at least the memory chip 100-1 is selected after the power supply noise disappears.

Further, as in the first embodiment, when requesting the memory chips 100-1 to 100-4 in this state to perform an operation not requiring chip addresses, for example, ID code reading, it is possible to avoid a situation in which none of the memory chips 100-1 to 100-4 can output signals.

As described above, the nonvolatile semiconductor memory of the present embodiment can perform a predetermined operation even when power supply noise is inputted.

Third Embodiment

The second embodiment described an example of the configuration of the power-on reset circuit for performing a predetermined operation even when power supply noise is inputted.

A third embodiment will particularly describe an example in which a power-on reset circuit includes a different switching circuit.

Figure 14:
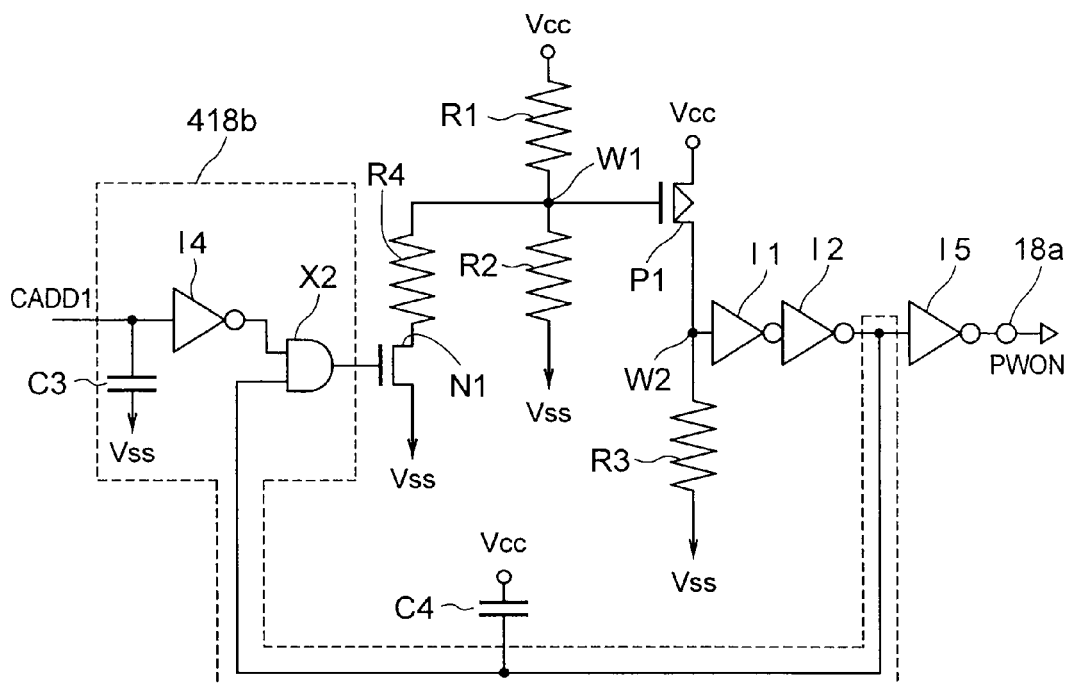
FIG. 14 is a circuit diagram showing the configuration of a power-on reset circuit 418 according to the third embodiment.

FIG. 14 is a circuit diagram showing the configuration of a power-on reset circuit 418 according to the third embodiment. The power-on reset circuit 418 is applicable to the memory chips 100-1 to 100-4 of FIG. 8 as the power-on reset circuit 318 of the second embodiment.

As shown in FIG. 14, as compared with the power-on reset circuit 318 of the second embodiment, the power-on reset circuit 418 includes a switching circuit 418*b* configured differently from the switching circuit 318*b* of the second embodiment.

The switching circuit 418*b* includes an AND circuit X2 acting as an arithmetic circuit, an inverter I4, and a capacitor C3.

The AND circuit X2 is fed with the output signal (the inverted signal of a signal CADD1) of the inverter I4 and the output signal (the inverted signal of a reset signal PWON) of the inverter I2 and has the output connected to the gate of an NMOS transistor acting as a switch element N1.

In this way, the switching circuit 418*b* outputs a signal obtained by performing a logical operation on the output signal of the inverter I4 and the output signal of the inverter I2, as a switching signal to the switch element N1.

A capacitor C4 has one end connected to a power supply and the other end connected to the output of the inverter I2. The capacitor C4 stabilizes the input of the AND circuit X2 at power-on.

The other configurations of the power-on reset circuit 418 are similar to the configurations of the power-on reset circuit 318 of the second embodiment.

The following will describe an example of the operation of a nonvolatile semiconductor memory 1000 to which the power-on reset circuit 418 is applied.

As in the second embodiment, the switching circuit 418*b* in the power-on reset circuit 418 of a memory chip 100-1 is set to be fed with the signal CADD1 ("High" level).

Thus the switching circuit 418*b* turns off (shuts off) the switch element N1 of the power-on reset circuit 418 regardless of the output signal of the inverter I2. Thus a resistive division by voltage dividing resistors R1 and R2 and a voltage dividing ratio adjusting resistor R4 has a small voltage dividing ratio on the power supply side.

In each of the power-on reset circuits 418 of memory chips 100-2 to 100-4, the switching circuit 418*b* is set to be fed with the signal CADD1 ("Low" level).

Thus in each of the memory chips 100-2 to 100-4, when the output signal of the inverter I2 is set at "Low" level, the switch element N1 of the power-on reset circuit 418 is turned off (shut off). With this operation, the resistive division by the voltage dividing resistors R1 and R2 and the voltage dividing ratio adjusting resistor R4 has a small voltage dividing ratio on the power supply side. Thus a voltage on a first contact W1 is increased.

In each of the memory chips 100-2 to 100-4, when the output signal of the inverter I2 is set at "High" level, the switch element N1 of the power-on reset circuit 418 is turned on (conducting). With this operation, the resistive division by the voltage dividing resistors R1 and R2 and the voltage dividing ratio adjusting resistor R4 has a large voltage dividing ratio on the power supply side. Thus the voltage on the first contact W1 is reduced.

In this way, in each of the power-on reset circuits 418 of the memory chips 100-2 to 100-4, the switching circuit 418*b* turns on the switch element N1 when a power supply voltage Vcc is lower than a certain set voltage. The switching circuit 418*b* turns off the switch element N1 when the power supply voltage Vcc is equal to or higher than the set voltage.

Thus when the power supply voltage Vcc is equal to or higher than the set voltage, the voltage on the first contact of the power-on reset circuit 418 in each of the memory chips 100-2 to 100-4 is lower than the voltage on the first contact W1 of the power-on reset circuit 418 in the memory chip 100-1.

Therefore, when the power supply voltage Vcc is equal to or higher than the set voltage, a power-on detecting voltage V1 of the memory chip 100-1 is set higher than power-on detecting voltages V2 to V4 of the other memory chips 100-2 to 100-4.

The resistance value of the voltage dividing ratio adjusting resistor R4 is selected such that differences between the power-on detecting voltage V1 of the memory chip 100-1 and the power-on detecting voltages V2 to V4 of the other memory chips 100-2 to 100-4 are as large as variations in detecting voltage among the memory chips, the variations being caused by variations in the threshold voltage of a PMOS transistor P1.

As described above, the initial power-on detecting voltage at power-on is set at the same voltage in all the memory chips. However, after power-on (after the completion of power-on reset), only the power-on detecting voltage V1 of the memory chip 100-1 is set higher than the power-on detecting voltages V2 to V4 of the other memory chips 100-2 to 100-4.

Thus the fourth embodiment can avoid only problems caused by power supply noise during operations, without affecting the initial power-on operation that is the original object of the power-on reset circuit.

As described above, the nonvolatile semiconductor memory of the present embodiment can perform a predetermined operation even when power supply noise is inputted.

Fourth Embodiment

A fourth embodiment will particularly describe an example in which a power-on reset circuit is controlled by a flip-flop.

Figure 15:
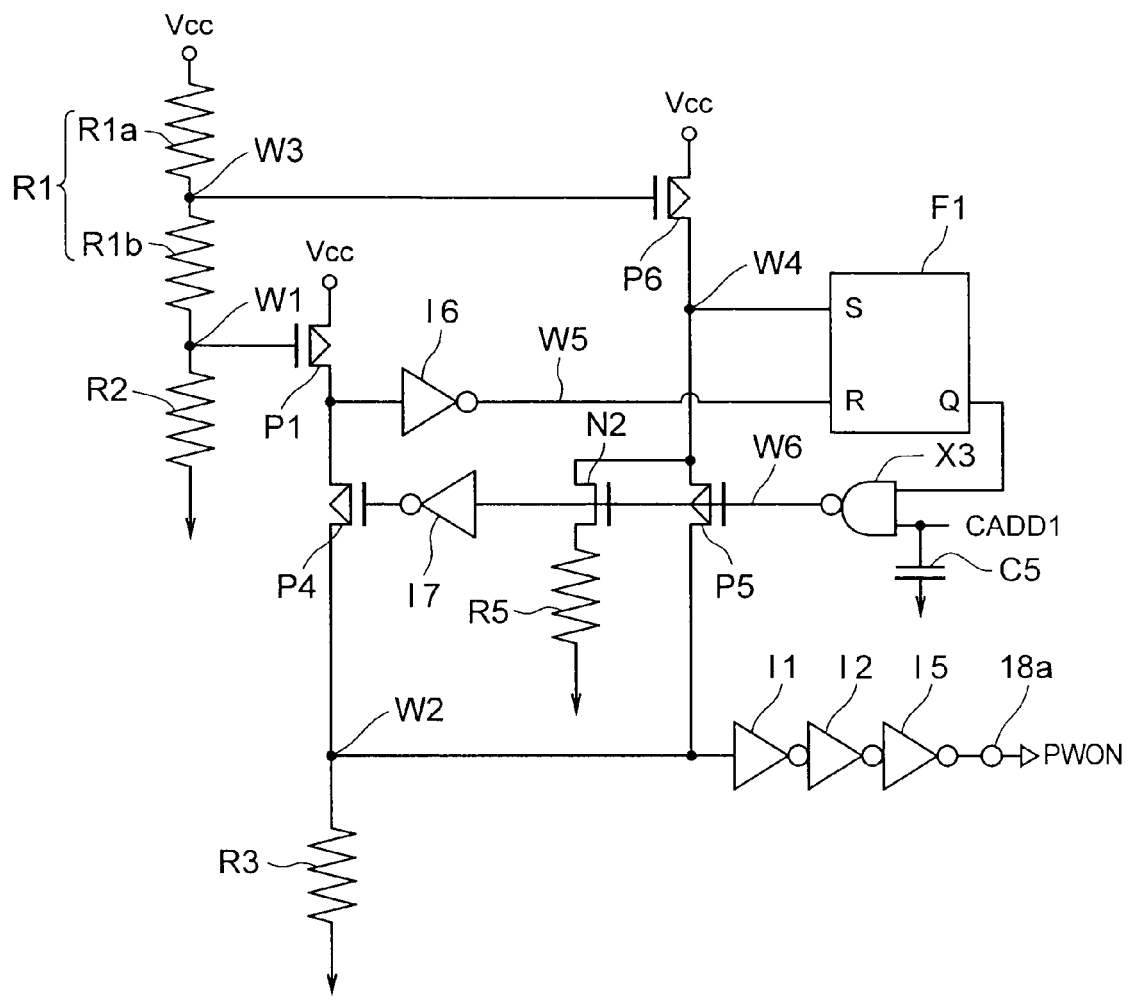
FIG. 15 is a circuit diagram showing the configuration of a power-on reset circuit 518 according to the fourth embodiment.

FIG. 15 is a circuit diagram showing the configuration of a power-on reset circuit 518 according to the fourth embodiment. The power-on reset circuit 518 is applicable to the memory chips 100-1 to 100-4 shown in FIG. 8.

As shown in FIG. 15, the power-on reset circuit 518 includes a first voltage dividing resistor R1, a second voltage dividing resistor R2, an output resistor R3, an adjusting resistor R5, PMOS transistors P1 and P6, switch elements N2, P4, and P5, an output terminal 18*a*, a flip-flop F1, a NAND circuit X3, a capacitor C5, and inverters I1, I2, and I5 to I7.

The first voltage dividing resistor R1 is divided into a voltage dividing resistor R1*a* and a voltage dividing resistor R1*b*.

A first contact W1 between the voltage dividing resistor R1*b* and the second voltage dividing resistor R2 is connected to the gate of the PMOS transistor P1. Thus at power-on, when a potential difference between a power supply voltage Vcc and a voltage on the first contact W1 is equal to the threshold voltage of the PMOS transistor P1, the PMOS transistor P1 is switched from off to on.

The switch element P4 made up of a PMOS transistor is connected to the drain of the PMOS transistor P1. The output resistor R3 is connected to a second contact W2 on the drain side of the switch element P4. The inverters I1, I2, and I5 are connected in series between the second contact W2 and the output terminal 18*a*.

A contact W3 between the voltage dividing resistor R1*a* and the voltage dividing resistor R1*b* is connected to the gate of the PMOS transistor P6.

A fourth contact W4 on the drain side of the PMOS transistor P6 is connected to a set terminal S of the flip-flop F1. The fourth contact W4 is connected to the source of the switch element P5 made up of a PMOS transistor. The drain of the switch element P5 is connected to the second contact W2.

A fifth contact W5 is connected to a reset terminal R of the flip-flop F1. The fifth contact W5 is connected to the drain of the PMOS transistor P1 via the inverter I6. The flip-flop F1 has an output Q inputted to the NAND circuit X3 with a signal CADD1. The capacitor C5 is connected between the ground and a terminal of the NAND circuit X3, the terminal being fed with the signal CADD1.

The output of the NAND circuit X3 is inputted to the gate of the switch element P5. Further, the output of the NAND circuit X3 is inputted to the gate of the switch element P4 via the inverter I7.

The switch element (NMOS transistor) N2 and the adjusting resistor R5 are connected in series between the fourth contact W4 and the ground. The switch element N2 has the gate fed with the output of the NAND circuit X3.

The following will describe the operation of the power-on reset circuit 518 configured thus.

A voltage on the third contact W3 is set higher than the voltage on the first contact W1 by a voltage obtained by dividing a power supply voltage Vcc by the voltage dividing resistors R1a, R1b, and R2. Thus when the power supply voltage Vcc rises, the PMOS transistor P1 is switched from off to on prior to the PMOS transistor P6. At this point, a voltage on the fifth contact W5 changes from "High" level to "Low" level. Thus the resetting operation of the flip-flop F1 is completed.

When the power supply voltage Vcc further increases, the PMOS transistor P6 is switched from off to on at a voltage obtained by dividing the power supply voltage Vcc by the voltage dividing resistors R1a, R1b, and R2. At this point, a voltage on the fourth contact W4 changes from "Low" level to "High" level. The flip-flop F1 is set by the voltage on the fourth contact W4 and thus "High" level is outputted from the output Q of the flip-flop F1.

When a chip address indicates the first chip (memory chip 100-1), the signal CADD1 is set at "High" level. Thus a sixth contact W6 is switched from "High" level to "Low" level, so that the switch element P4 is switched from on to off and the switch element P5 is switched from off to on.

With these operations, the power-on reset circuit 518 of the memory chip 100-1 outputs a reset signal PWON when the power supply voltage Vcc is equal to a power-on detecting voltage set by the threshold voltage of the PMOS transistor P1 at the beginning of power-on. However, after power-on with the power supply voltage Vcc being equal to or higher than the power-on detecting voltage set by the threshold voltage of the PMOS transistor P6, the power-on reset circuit 518 of the memory chip 100-1 outputs the reset signal PWON when the power supply voltage Vcc is equal to the power-on detecting voltage of the PMOS transistor P6, the power-on detecting voltage being higher than the power-on detecting voltage of the PMOS transistor P1.

In memory chips 100-2 to 100-4 other than the memory chip 100-1, the signal CADD1 is set at "Low" level. Thus the sixth contact W6 is always set at "High" level. In response to the setting, the switch element P4 is turned on and the switch element P5 is turned off. Thus the reset signal PWON is outputted simply when the power supply voltage Vcc is equal to the power-on detecting voltage set by the PMOS transistor P1.

The voltage dividing resistor R1a and the voltage dividing resistor R1b are set such that a difference between the power-on detecting voltages of the PMOS transistor P1 and the PMOS transistor P6 has a value enabling compensation for variations in the threshold values of the PMOS transistors.

Thus when the power supply voltage is reduced by noise, the memory chip 100-1 is first reset without fail. It is therefore possible to avoid a situation in which all the memory chips become inoperable.

Further, at power-on, all memory chips including the memory chip 100-1 are set in a similar manner and thus do not affect a normal operation. Thus it is easy to set noise immunity in the memory chip 100-1 and the other memory chips 100-2 to 100-4.

Fifth Embodiment

A fifth embodiment will describe an example in which the nonvolatile semiconductor memory 1000 is applied to a cellular phone illustrated as an example of electronic equipment.

Figure 16:
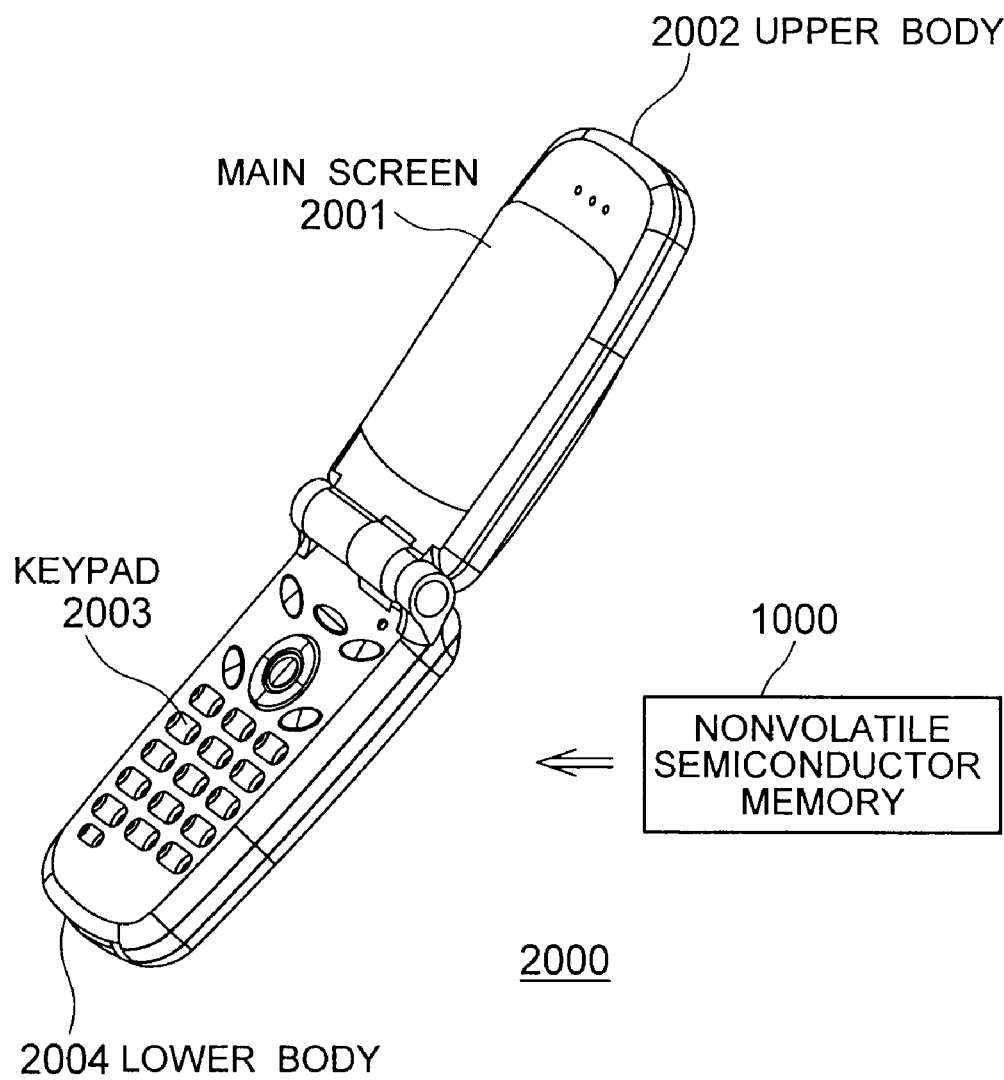
FIG. 16 shows a cellular phone including the nonvolatile semiconductor memory 1000.

FIG. 16 shows a cellular phone including the nonvolatile semiconductor memory 1000. As shown in FIG. 16, a cellular phone 2000 includes an upper body 2002 having a main screen 2001 and a lower body 2004 having a keypad 2003. The nonvolatile semiconductor memory (semiconductor chip) 1000 is installed in the cellular phone 2000.

A CPU (not shown) installed in the cellular phone 2000 accesses the nonvolatile semiconductor memory 1000 via an interface (not shown) and transfers data and so on.

The nonvolatile semiconductor memory 1000 is further applicable to various kinds of electronic equipment such as a personal computer, a digital still camera, and a PDA as well as the cellular phone.

What is claimed is:
1. A nonvolatile semiconductor memory comprising:
a first memory chip set so as to be operated by specifying the chip address upon reset; and
a second memory chip set so as not to be specified by the chip address and not to be operated upon reset,
the first memory chip and the second memory chip each comprising a power-on reset circuit which detects a power supply voltage after power-on and outputs a reset signal for resetting an operation when the power supply voltage is equal to or higher than a predetermined value,
the power-on reset circuit including:
a first voltage dividing resistor having one end connected to a power supply;
a second voltage dividing resistor connected between an other end of the first voltage dividing resistor and ground;
a PMOS transistor having a source connected to the power supply and a gate fed with a voltage corresponding to a voltage on a first contact between the first voltage dividing resistor and the second voltage dividing resistor;
an output resistor connected between a drain of the PMOS transistor and the ground;
a switch element connected between the power supply and the first contact;
a voltage dividing ratio adjusting resistor connected in series with the switch element between the power supply and the first contact;
a switching circuit which outputs a switching signal for switching on/off the switch element; and
an output terminal connected to a second contact between the PMOS transistor and the output resistor to output the reset signal,
wherein in the power-on reset circuit of the first memory chip, the switching circuit turns on the switch element, and
in the power-on reset circuit of the second memory chip, the switching circuit turns off the switch element.

2. The nonvolatile semiconductor memory of claim 1, wherein the switching circuit switches on/off the switch element based on the chip address.

3. The nonvolatile semiconductor memory of claim 1, wherein the first memory chip and the second memory chip are NAND flash memory chips.

4. The nonvolatile semiconductor memory of claim 2, wherein the first memory chip and the second memory chip are NAND flash memory chips.

5. The nonvolatile semiconductor memory of claim 1, wherein the switch element is a transistor.

6. The nonvolatile semiconductor memory of claim 2, wherein the switch element is a transistor.

7. The nonvolatile semiconductor memory of claim 3, wherein the switch element is a transistor.

8. A nonvolatile semiconductor memory comprising:
a first memory chip set so as to be operated by specifying the chip address upon reset; and
a second memory chip set so as not to be specified by the chip address and not to be operated upon reset,
the first memory chip and the second memory chip each comprising a power-on reset circuit which detects a power supply voltage after power-on and outputs a reset signal for resetting an operation when the power supply voltage is equal to or higher than a predetermined value,
the power-on reset circuit including:
a first voltage dividing resistor having one end connected to a power supply;
a second voltage dividing resistor connected between an other end of the first voltage dividing resistor and ground;
a PMOS transistor having a source connected to the power supply and a gate fed with a voltage corresponding to a voltage on a first contact between the first voltage dividing resistor and the second voltage dividing resistor;
an output resistor connected between a drain of the PMOS transistor and the ground;
a switch element connected between the ground and the first contact;
a voltage dividing ratio adjusting resistor connected in series with the switch element between the ground and the first contact;
a switching circuit which outputs a switching signal for switching on/off the switch element; and
an output terminal connected to a second contact between the PMOS transistor and the output resistor to output the reset signal,
wherein in the power-on reset circuit of the first memory chip, the switching circuit turns off the switch element, and
in the power-on reset circuit of the second memory chip, the switching circuit turns on the switch element.

9. The nonvolatile semiconductor memory of claim 8, wherein the switching circuit switches on/off the switch element based on the chip address.

10. The nonvolatile semiconductor memory of claim 8, wherein the first memory chip and the second memory chip are NAND flash memory chips.

11. The nonvolatile semiconductor memory of claim 9, wherein the first memory chip and the second memory chip are NAND flash memory chips.

12. The nonvolatile semiconductor memory of claim 8, wherein the switch element is a transistor.

13. The nonvolatile semiconductor memory of claim 9, wherein the switch element is a transistor.

14. The nonvolatile semiconductor memory of claim 10, wherein the switch element is a transistor.

15. A nonvolatile semiconductor memory comprising:
a first memory chip set so as to be operated by specifying the chip address upon reset; and
a second memory chip set so as not to be specified by the chip address and not to be operated upon reset,
the first memory chip and the second memory chip each comprising a power-on reset circuit which detects a power supply voltage after power-on and outputs a reset signal for resetting an operation when the power supply voltage is equal to or higher than a predetermined value,
the power-on reset circuit including:
a first voltage dividing resistor having one end connected to a power supply;
a second voltage dividing resistor connected between an other end of the first voltage dividing resistor and ground;
a PMOS transistor having a source connected to the power supply and a gate fed with a voltage corresponding to a voltage on a first contact between the first voltage dividing resistor and the second voltage dividing resistor;
an output resistor connected between a drain of the PMOS transistor and the ground;
a switch element connected between the ground and the first contact;
a voltage dividing ratio adjusting resistor connected in series with the switch element between the ground and the first contact;
a switching circuit which outputs a switching signal for switching on/off the switch element; and
an output terminal connected to a second contact between the PMOS transistor and the output resistor to output the reset signal,
wherein in the power-on reset circuit of the first memory chip, the switching circuit turns off the switch element, and
in the power-on reset circuit of the second memory chip, the switching circuit turns off the switch element when the power supply voltage is lower than a set voltage, and the switching circuit turns on the switch element when the power supply voltage is equal to or higher than the set voltage.

16. The nonvolatile semiconductor memory of claim 15, wherein the switching circuit switches on/off the switch element based on the chip address.

17. The nonvolatile semiconductor memory of claim 15, wherein the first memory chip and the second memory chip are NAND flash memory chips.

18. The nonvolatile semiconductor memory of claim 16, wherein the first memory chip and the second memory chip are NAND flash memory chips.

19. The nonvolatile semiconductor memory of claim 15, wherein the switch element is a transistor.

20. The nonvolatile semiconductor memory of claim 16, wherein the switch element is a transistor.

* * * * *